(12) United States Patent
Brown et al.

(10) Patent No.: US 6,835,950 B2
(45) Date of Patent: Dec. 28, 2004

(54) ORGANIC ELECTRONIC DEVICES WITH PRESSURE SENSITIVE ADHESIVE LAYER

(75) Inventors: Julia J. Brown, Yardley, PA (US); Jeffrey Alan Silvernail, Yardley, PA (US); Michael Stuart Weaver, Princeton, NJ (US); Anna Chwang, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 18 days.

(21) Appl. No.: 10/122,969

(22) Filed: Apr. 12, 2002

(65) Prior Publication Data

US 2003/0197197 A1 Oct. 23, 2003

(51) Int. Cl.$^7$ .............................................. H01L 51/00
(52) U.S. Cl. ............................ 257/40; 257/13; 257/79; 257/642; 257/753; 257/759; 257/918; 438/22; 438/82; 438/99
(58) Field of Search ...................... 257/40, 13, 79.103, 257/642, 753, 759, 918, 79; 438/82, 99, 118, 628, 644, 654, 725, 753, 780, 22; 313/500, 503, 504, 506, 509, 512

(56) References Cited

U.S. PATENT DOCUMENTS

| | | | | |
|---|---|---|---|---|
| 4,842,893 A | 6/1989 | Yializis | ........................ | 427/44 |
| 4,954,371 A | 9/1990 | Yializis | ........................ | 427/44 |
| 5,260,095 A | 11/1993 | Affinito | ........................ | 427/124 |

(List continued on next page.)

FOREIGN PATENT DOCUMENTS

| | | | | |
|---|---|---|---|---|
| EP | 0405361 A1 | 1/1991 | ............ | H05B/33/04 |
| EP | 1116987 A2 | 7/2001 | ......... | G02F/1/1335 |
| JP | 08236271 | 9/1996 | ............ | H05B/33/04 |

(List continued on next page.)

OTHER PUBLICATIONS

Hybrid Design for Organic Electroluminescent Devices, IBM Technical Disclosure Bulletin, Sep. 1, 1997, vol. 40, Issue 9, p. 115–116.*
Craig Adhesives and Coatings Company, UV Pressure Sensitive Adhesives, http://www.craigadhesives.com/UVLaminating.htm; and Products, http://www.craigadhesives.com/products.htm.
Adhesives Research Inc., Standard Product Catalogue, http://www.adhesivesresearch.com/catalog/home/htm; Specialty Industrial and Electronics Tapes, www.adhesivesresearch.com/catalog/Indust.htm; Industrial and Electronics Products, www.adhesivesresearch.com/catalog/indeice.htm; Product Development Process, www.adhesivesresearch.com/techentr/ateprddy.htm; and Materials Technologies, www.adhesivesresearch.com/techentr/atcmatr.htm.
"Vertical–Cavity Organic Light–Emitting Diode Display," IBM Technical Disclosure Bulletin, vol. 40, No. 9, Sep. 1997, pp. 165–167.

Primary Examiner—David Nelms
Assistant Examiner—Long Tran
(74) Attorney, Agent, or Firm—Mayer Fortkort & Williams, PC; David B. Bonham, Esq.

(57) ABSTRACT

An organic electronic device structure, according to a first aspect of the invention, includes: (a) a substrate layer; (b) an organic electronic region disposed over the substrate layer; (c) a pressure sensitive adhesive layer disposed over the organic electronic device; and (d) a barrier layer disposed over the adhesive layer. According to a second aspect of the present invention, an organic electronic device structure includes: (a) a substrate layer; (b) an organic electronic region disposed over the substrate layer; (c) a barrier layer disposed over the organic electronic region; (d) a pressure sensitive adhesive layer disposed over the substrate layer and over the barrier layer; and (e) an additional layer disposed over the adhesive layer. In many preferred embodiments, the organic electronic device region is an OLED region.

29 Claims, 6 Drawing Sheets

U.S. PATENT DOCUMENTS

| | | | |
|---|---|---|---|
| 5,304,419 A | 4/1994 | Shores | 428/355 |
| 5,707,745 A | 1/1998 | Forrest et al. | 428/432 |
| 5,757,126 A | 5/1998 | Harvey, III et al. | 313/506 |
| 5,920,080 A * | 7/1999 | Jones | 257/40 |
| 6,146,225 A | 11/2000 | Sheats et al. | 445/24 |
| 6,224,948 B1 | 5/2001 | Affinito | 427/488 |
| 6,268,695 B1 | 7/2001 | Affinito | 313/504 |
| 2002/0125822 A1 * | 9/2002 | Graff et al. | 313/506 |
| 2003/0062830 A1 * | 4/2003 | Guenther et al. | 313/512 |
| 2003/0143423 A1 * | 7/2003 | McCormick et al. | 428/690 |

FOREIGN PATENT DOCUMENTS

| | | | |
|---|---|---|---|
| WO | WO 00/26973 | 5/2000 | H01L/51/10 |
| WO | WO 00/36665 | 6/2000 | H01L/51/20 |
| WO | WO 02/05361 | 1/2002 | H01L/51/20 |
| WO | WO 03/065470 A1 | 8/2003 | H01L/51/20 |

* cited by examiner

ORGANIC ELECTRONIC DEVICES WITH PRESSURE SENSITIVE ADHESIVE LAYER

FIELD OF THE INVENTION

The present invention relates to organic electronic devices that are protected from environmental elements such as moisture and oxygen.

BACKGROUND OF THE INVENTION

Organic electronic devices including circuits, for example, organic light emitting diodes, organic electrochromic displays, organic photovoltaic devices and organic thin film transistors, are known in the art and are becoming increasingly important from an economic standpoint.

As a specific example, organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and are relatively easy and inexpensive to fabricate. Also, OLEDs readily lend themselves to applications requiring a wide variety of colors and to applications that concern large-area devices.

Figure 1A:
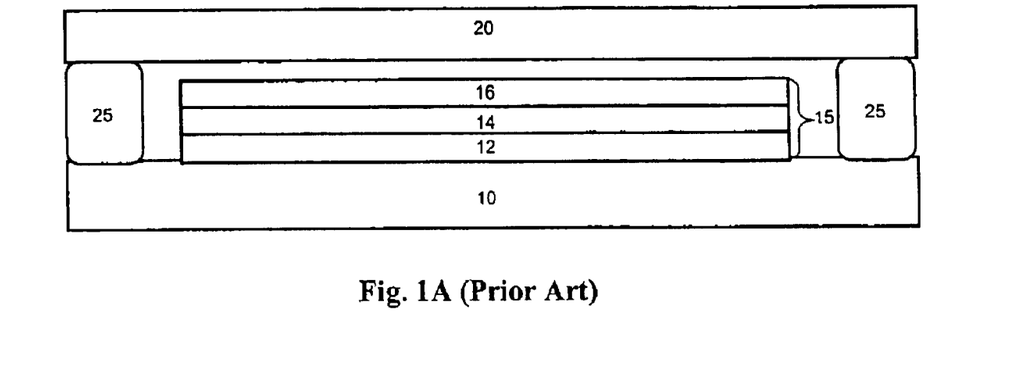
FIGS. 1A and 1B are schematic representations (cross-sectional views) of known OLED structures.

In general, two-dimensional OLED arrays for imaging applications are known in the art and typically include an OLED region, which contains a plurality of pixels arranged in rows and columns. FIG. 1A is a simplified schematic representation (cross-sectional view) of an OLED structure of the prior art. The OLED structure shown includes an OLED region 15 which includes a single pixel comprising an electrode region such as anode region 12, a light emitting region 14 over the anode region 12, and another electrode region such as cathode region 16 over the a light emitting region 14. The OLED region 15 is disposed on a substrate 10.

Traditionally, light from the light-emitting layer 14 passed downward through the substrate 10. In such a "bottom-emitting" configuration, the substrate 10 and anode 12 are formed of transparent materials. The cathode 16 and cover 20 (i.e., barrier), on the other hand, need not be transparent in this configuration.

Other OLED architectures are also known in the art, including "top-emitting" OLEDs and transparent OLEDs (or "TOLEDs"). For top-emitting OLEDS, light from the light emitting layer 14 is transmitted upward through cover 20. Hence, the substrate 10 can be formed of opaque material, while the cover 20 is transparent. In top-emitting configurations based on a design like that illustrated in FIG. 1A, a transparent material is used for the cathode 16, while the anode 12 need not be transparent.

For TOLEDS, in which light is emitted out of both the top and bottom of the device, the substrate 10, anode 12, cathode 16 and cover 20 are all transparent.

Figure 1B:
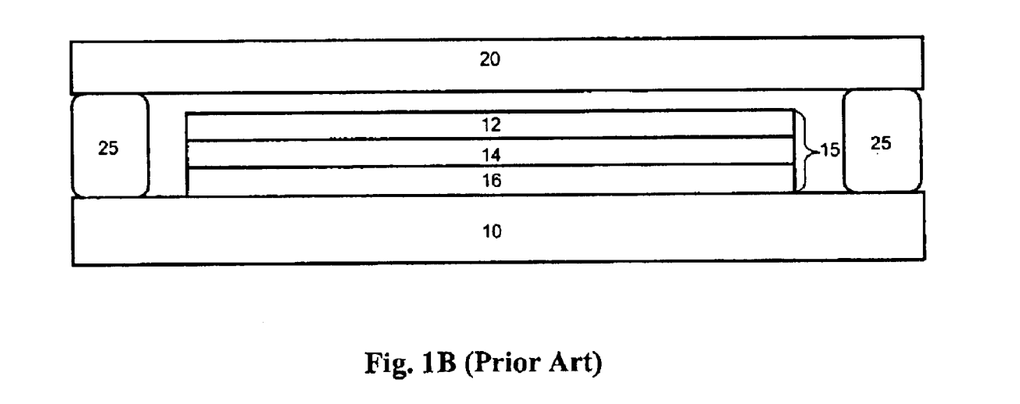

Structures are also known in which the positions of the anode 12 and cathode 16 in FIG. 1A are reversed as illustrated in FIG. 1B. Such devices are sometimes referred to as "inverted OLEDS".

In forming an OLED, a layer of reactive metal is typically utilized as the cathode to ensure efficient electron injection and low operating voltages. However, reactive metals and their interface with the organic material are susceptible to oxygen and moisture, which can severely limit the lifetime of the devices. Moisture and oxygen are also known to produce other deleterious effects. For example, moisture and oxygen are known in the art to increase "dark spots" and pixel shrinkage in connection with OLEDS.

With the aid of a sealing region 25, the cover 20 and the substrate 10 cooperate to restrict transmission of oxygen and water vapor from an outer environment to the active pixel 15. Typically, the cover 20 is attached to the substrate 10 via sealing region 25 under a clean, dry, inert atmosphere.

Sealing region 25 is commonly an epoxy resin adhesive. Epoxy resins, however, are typically not flexible, rendering these materials undesirable for use in connection with flexible OLEDs (or "FOLEDS"). In addition, because they are typically inflexible, because they are not pressure sensitive, and because they are typically applied in liquid form, epoxy resins are not readily adaptable for use in web-based manufacturing techniques. Moreover, epoxy resins frequently contain ingredients that are deleterious to OLEDS. Analogous difficulties are encountered in organic electronic devices other than OLEDS.

SUMMARY OF THE INVENTION

The above and other challenges of the prior art are addressed by the present invention.

According to a first aspect of the invention, an organic electronic device structure is provided, which comprises: (a) a substrate layer; (b) an organic electronic region disposed over the substrate layer; (c) a pressure sensitive adhesive layer disposed over the organic electronic device; and (d) a barrier layer disposed over the adhesive layer. In many preferred embodiments, the organic electronic device region is an OLED region.

The adhesive layer can be disposed over all or a portion of the organic electronic region. For example, the adhesive layer can be, for example, in the form a continuous layer that is disposed over the entire organic electronic region or in the form of a ring that is disposed over only a portion of the organic electronic region.

The adhesive layer may be, for example, a low-temperature-curable adhesive layer. In preferred embodiments, the adhesive layer is a radiation-curable adhesive layer, more preferably an ultraviolet-radiation-curable adhesive layer. The adhesive layer also preferably displays low out-gassing of harmful species, as defined hereinbelow.

In many embodiments, the organic electronic device structure will include a getter material, which can be provided within the adhesive region, if desired, or elsewhere.

Preferred substrate layers, and barrier layers, for use in the organic electronic device structures of this aspect of the present invention include metal layers, semiconductor layers, glass layers, ceramic layers, polymer layers and composite material layers. Where a composite material layer is selected, it preferably comprises (a) a polymer substrate sub-layer and (b) at least two alternating pairs of high-density sub-layers and planarizing sub-layers. The planarizing sub-layers may be the same or different from each other, as can the high-density sub-layers.

In some instances, it is preferred to include a protective layer between the organic electronic region and the adhesive layer of the organic electronic device structure. The protective layer comprises, for example, a material selected from a silicon oxide, a silicon nitride, a silicon oxynitride, a metal oxide, an organic compound and an organometallic compound. As another example, the protective layer comprises one or more high-density sub-layers and one or more planarizing sub-layers.

In other embodiments, one or more spacer structures are provided between the substrate layer and the adhesive layer to prevent the adhesive layer from physically damaging the OLED region.

According to a second aspect of the present invention, an organic electronic device structure is provided, which comprises: (a) a substrate layer; (b) an organic electronic region disposed over the substrate layer; (c) a barrier layer disposed over the organic electronic region; (d) a pressure sensitive adhesive layer disposed over the substrate layer and over the barrier layer; and (e) an additional layer disposed over the adhesive layer. In many preferred embodiments, the organic electronic device region is an OLED region.

The adhesive layer in accordance with this aspect of the invention can be disposed over all or a portion of the barrier layer. The adhesive layer can be, for example, in the form a continuous layer that is disposed over the entire barrier layer or in the form of a ring that is disposed over only a portion of the barrier layer.

As above, the adhesive layer may be, for example, a low-temperature-curable adhesive layer. In some preferred embodiments, the adhesive layer is a radiation-curable adhesive layer, more preferably an ultraviolet-radiation-curable adhesive layer. The adhesive layer also preferably displays low out-gassing of harmful species, as defined hereinbelow.

Also as above, preferred substrate layers for use in the organic electronic device structures of this aspect of the present invention include metal layers, semiconductor layers, glass layers, ceramic layers, polymer layers and composite material layers. Where a composite material layer is selected, it preferably comprises (a) a polymer substrate sub-layer and (b) at least two alternating pairs of high-density sub-layers and planarizing sub-layers. Preferred barrier layers are composite material layers that comprise at least two alternating pairs of high-density sub-layers and planarizing sub-layers. The above planarizing sub-layers may be the same or different from each other, as can the high-density sub-layers.

The additional layer in accordance with this aspect of the invention can have, for example additional barrier properties, scratch resistant properties, antireflective properties and/or circular polarizing properties. The latter properties are particularly preferred where the organic electronic device structure is a transparent OLED device structure or a top-emitting OLED device structure.

According to yet another aspect of the invention, a method for providing an organic electronic device structure of provided. The method comprises: (1) providing a first region comprising (a) a substrate layer and (b) an organic electronic region provided over the substrate layer; (2) providing a second region comprising at least one additional layer; and (3) adhering the first region to the second region using a pressure sensitive adhesive layer. In this aspect of the invention, the organic electronic region is provided over the substrate layer prior to contacting the first region with the adhesive layer. In many preferred embodiments, the organic electronic device structure is an OLED structure.

The method can be, for example, a roll-to-roll processing method, allowing for continuous device production.

In many preferred embodiments, the first region is adhered to the second region by a method comprising: (a) providing an adhesive-primed region comprising (i) the adhesive layer and (ii) one of the first and second regions; and (b) contacting the adhesive-primed region with the other of the first and second regions. In these embodiments, the adhesive layer can be transferred from a release liner to either the first or the second regions to form the adhesive primed region.

In some embodiments, a barrier layer is provided with the first region, in which case the organic electronic region is positioned between the substrate layer and the barrier layer. The second region in these embodiments can comprise, for example, a layer having additional barrier properties, scratch resistant properties, antireflective properties, and/or circular polarizing properties. In other embodiments, a barrier layer is provided within the second region.

During production, gas bubbles can become trapped (a) within the adhesive layer or (b) between the adhesive layer and either or both of the first and second regions. In either case, it is preferred to remove such bubbles, for example, by applying one or more of (a) heat, (b) pressure and (c) vacuum.

Analogous to the above, the adhesive layer is preferably cured without the application of high temperatures. In some preferred embodiments, the adhesive layer is subjected to a radiation-curing step, more preferably, to an ultraviolet-radiation-curing step.

An advantage of the present invention is that organic electronic structures are provided, which are effective in protecting sensitive device components from oxygen, moisture and other harmful species in the surrounding atmosphere.

Another advantage of the present invention is that organic electronic structures are provided, which afford protection from these harmful species, while at the same time being flexible and conformable to other surfaces, if desired.

Another advantage of the present invention is that organic electronic structures are provided, which contain adhesive systems that are not deleterious to the protected device components.

Still another advantage of the present invention is that organic electronic structures are provided, which are amenable to continuous processing techniques, such as web-based (e.g., roll-to-roll) manufacturing methods.

These and other aspects, embodiments and advantages of the present invention will become readily apparent to those of ordinary skill in the art upon review of the disclosure to follow.

BRIEF DESCRIPTION OF THE DRAWINGS

As is typically the case with such figures, the above are simplified schematic representations presented for purposes of illustration only, and the actual structures will differ in numerous respects including the relative scale of the components.

DETAILED DESCRIPTION OF THE INVENTION

The present invention now will be described more fully hereinafter with reference to the accompanying drawings in which preferred embodiments of the invention are shown. This invention may, however, be embodied in different forms and should not be construed as limited to the embodiments set forth herein. For example, although the embodiments below are directed to OLED structures, the techniques and structures of the present invention are applicable to other organic electronic devices as well.

As used herein, a "layer" of a given material includes a region of that material whose thickness is small compared to both its length and width. Examples of layers include sheets, foils, films, laminations, coatings, and so forth. As used herein, a layer need not be planar, but can be bent, folded or otherwise contoured, for example, to at least partially, or even completely, envelop another component. As used herein, a layer can also include multiple sub-layers. As used herein, a layer can constitute a single region of material (for example, a patterned layer can be provided in the form of a ring) or it can consist of a collection of discrete regions of material (for example, a patterned layer can be provided in the form of a collection of bands or dots).

Figure 2:
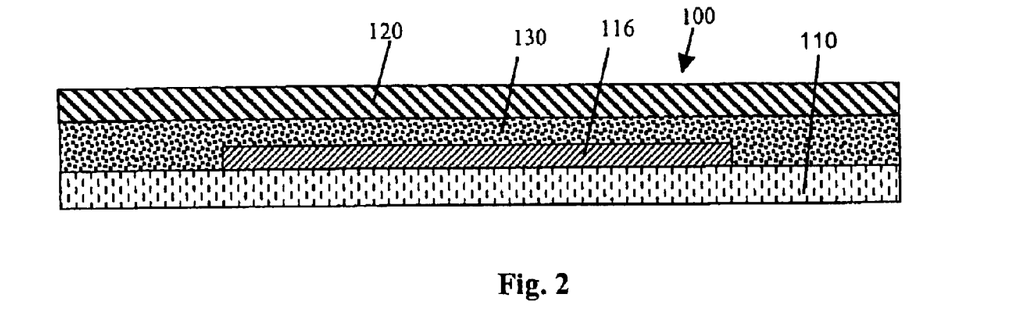
FIG. 2 is a schematic cross-sectional view of an OLED structure in accordance with one embodiment of the present invention.

FIG. 2 is a simplified schematic representation (cross-sectional view) of an OLED structure 100 in accordance with an embodiment of the present invention. The OLED structure 100 includes an OLED region 116 situated on a substrate layer 110. Over the OLED region 116 is a barrier layer 120. An adhesive layer 130 is provided to attach the barrier layer 120 to the OLED region 116 and substrate layer 110.

The substrate layer 110 and barrier layer 120 are selected to, among other things, restrict transmission of oxygen and water from the outside environment to the OLED region 116. Depending on the application, the substrate layer 110 and barrier layer 120 can be opaque or transparent. For traditional bottom-emitting OLED structures, the substrate layer 110 will be transparent, as least in part, while the barrier layer 120 can be opaque. For top-emitting OLED structures, the substrate layer 110 can be opaque, while the barrier layer 120 will be will be transparent, at least in part. For TOLED structures, both the substrate layer 110 and the barrier layer 120 will be transparent, at least in part.

The materials selected for the substrate layer 110 and barrier layer 120 will depend upon the application at hand and include semiconductors, metals, ceramics, polymers and composite layers.

Semiconductors such as silicon offer good barrier properties to water, oxygen and other harmful species and also provide a substrate layer upon which electronic circuitry can be built.

Metals also offer excellent barrier properties. Preferred materials include aluminum, gold, nickel, nickel alloys and indium, as well as other metals known in the art. Metals can be provided in a number of configurations as a barrier layer or substrate layer for an OLED structure, such as in the form of metal cans and foils. Where flexibility is desired, metal foils are preferred. For instance, OLED structures are known in the art that are referred to a flexible OLEDs (or "FOLEDS"). As the name suggests, these structures are flexible in nature, utilizing flexible substrate layer 110 and barrier layer 120 materials.

Ceramics also offer low permeability, and they provide transparency as well in some cases.

Polymers are often preferred where optical transparency is desired and flexibility is desired. Preferred low permeability polymers include polyesters, polyethersulphones, polyimides and fluorocarbons.

Composite materials are also among those materials preferred for use in connection with the substrate layer 110 and barrier layer 120. Composite materials are advantageous, for example, in that they can provide transparency and flexibility, while also providing good resistance to transmission of chemical species such as water and oxygen. Composite materials are discussed further below in connection with FIGS. 5 and 6.

The adhesive layer 130 of FIG. 2 preferably provides a barrier to adverse exterior environmental species, including water and oxygen, and provides good adhesion between adjacent regions. The adhesive layer 130 also preferably displays low out-gassing of harmful species. As used herein, "displays low out-gassing of harmful species" means that out-gassing is sufficiently minimized to prevent unacceptably low product quality during production. For example, with respect to OLEDs, this expression means that out-gassing is sufficiently low to prevent the formation of an unacceptably high dark spot levels and/or pixel shrinkage during production and through the intended lifetime of the display.

The adhesive layers 130 of the present invention is also preferably a pressure sensitive adhesive, at least before it is cured. As used herein, a "pressure sensitive" adhesive is one that adheres with as little as finger pressure, while requiring no activation for adhesion. Moreover, as discussed further below, in some embodiments of the invention, the adhesive layers of the present invention are provided on a release layer, making them desirable for web-based manufacturing techniques.

Preferred pressure sensitive adhesives for the adhesive layers 130 of the present invention include the following: ARclean™ and ARclad® low-out-gassing adhesives available from Adhesives Research, Inc., Glen Rock, Pa.; Ultra-Clean Laminating Adhesive 501FL and Optically Clear Laminating Adhesive 8141 both available from 3M Bonding Systems Division, St. Paul, Minn.; and 1034-series adhesives available from Craig Adhesives and Coatings Company, Newark, N.J. The thickness of the adhesive region typically ranges from 0.5 to 10 mils, more preferably 0.5 to 5 mils.

The OLED region 116 can be any design known in the art. For example, the OLED region 116 can comprise one or many pixels, which as, noted above, typically comprise an anode layer, a cathode layer, and a light-emitting layer (emission layer) disposed between the anode and cathode layer.

Depending on the application, the anode layer may be transparent or opaque. Opaque anode materials include metals such as gold, chromium, magnesium/silver or other materials known in the art, while transparent anode materials include metal oxides such as indium tin oxide (ITO), zinc tin oxide or other materials known in the art. Similarly, the cathode can be transparent or opaque depending on the application. Opaque cathode materials may include metals such as aluminum and aluminum/lithium or other materials is known in the art, while transparent cathode materials may include metal/metal oxide combinations such as Mg—Ag/ITO, Ca/ITO or other materials known in the art.

The light emitting layer can be provided in connection with a number of configurations, including the following: (a) a three-layer configuration comprising a hole transporting sub-layer, an emission sub-layer and an electron transporting sub-layer (i.e., a double heterostructure configuration), (b) a two-layer configuration comprising a hole transporting sub-layer and a sub-layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architecture is also practiced in the art.

An advantage of an OLED structure 100 like that of FIG. 2 is that it is effective in protecting sensitive device components from oxygen, moisture and other harmful species in the surrounding atmosphere. This structure is also advantageous in that it is possible to produce OLED structures that are flexible and conformable to other surfaces.

Furthermore, with the OLED structure 100 shown, the barrier layer 120 is securely affixed to the substrate layer 110. This is believed to be due to the fact that a large interfacial area exists between the adhesive layer 130 and adjacent regions. Moreover, where a thin adhesive layer 130 is utilized (e.g., 0.5 to 5 mils), there is only a very small difference in the radii of curvature between the layers on opposite sides of the adhesive layer 130, minimizing stresses that arise upon flexing the structure 100.

The device of FIG. 2 can be constructed in a number of ways. According to one embodiment, the adhesive layer 130 is provided between two regions: (a) the barrier layer 120 and (b) the substrate layer 110 with attached OLED region 116. Any bubbles within the adhesive layer 130 or between the adhesive layer 130 and the adjacent regions can then be removed, for instance, by heating the adhesive layer 130 to lower the viscosity of the same (e.g., by heating to 40 to 70° C.), by applying a vacuum (e.g., in connection with a vacuum oven) to the structure, by applying pressure (e.g., using rollers) to the structure, or by a combination of two or all three of these techniques. After bubble removal, the resulting OLED structure 110 is preferably exposed to a cure step (e.g., exposure to ultraviolet light) to cure of the adhesive layer 130.

Figure 3:
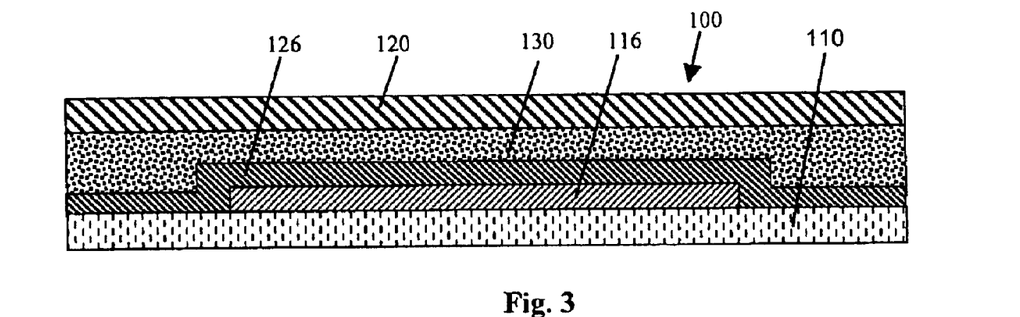
FIG. 3 is a schematic cross-sectional view of an OLED structure in accordance with another embodiment of the present invention.

In some embodiments, a protective layer 126 is provided between the adhesive layer 130 and the OLED region 116 as illustrated in FIG. 3. Protective layers are beneficial, for example, where the adhesive layer 130 contains particulate materials that would otherwise harm the OLED region 116. In this instance, the protective layer 126 should be sufficiently thick and/or tough, such that the particulate materials in the adhesive layer 130 do not puncture the protective layer 126 and damage the underlying OLED region 116. Preferred materials for the protective layer 126 include organometallic materials such as copper phthalocyanine (CuPc), organic compounds such as 4,4'-bis[N-(1-napthyl)-N-phenyl-amino] biphenyl (NPD), silicon compounds such as silicon oxide, silicon nitride and silicon oxynitride, metal oxides such as aluminum oxide, indium-tin oxide and zinc indium tin oxide, some of which materials are used as high-density materials for the cooperative barrier sub-layer structures discussed below.

The protective layer 126 can also be a composite layer. For example, the protective layer can consist of a high-density sub-layer (e.g., a thin oxide layer) deposited over the OLED, followed by a planarizing (e.g., polymer) sub-layer and another high-density (e.g., oxide) sub-layer.

Another way of addressing the presence of particulate materials in the adhesive layer 130 is by providing spacer structures (not shown) to separate the adhesive layer 130 from critical elements within the OLED region 116. For example, where the OLED region contains a plurality of active pixels arranged in rows and columns, such spacer structures can be provided between the active pixels.

Figure 4:
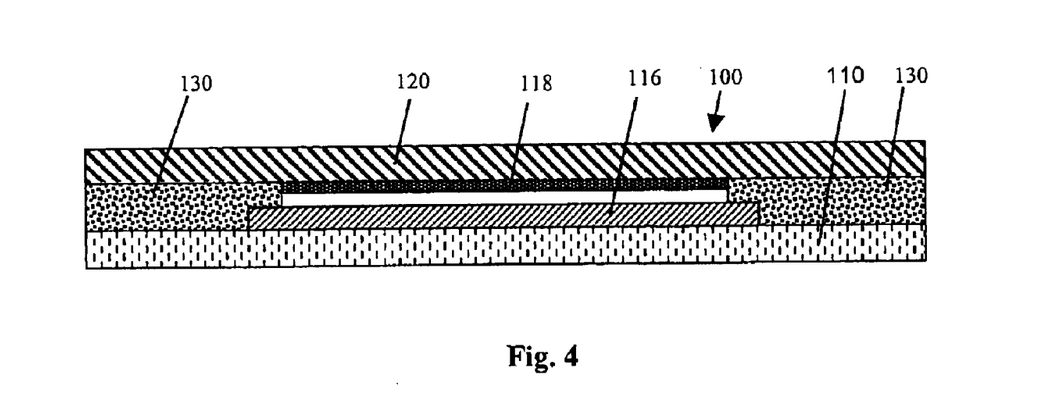
FIG. 4 is a schematic cross-sectional view of an OLED structure in accordance with yet another embodiment of the present invention.

Although the adhesive layers 130 illustrated in FIGS. 2 and 3 lie adjacent to essentially the entire surface of the barrier layer 120 (this configuration is referred to herein as a "face seal"), other configurations are possible. For example, as seen in FIG. 4, the adhesive layer 130 can be provided in the form of a layer that is patterned in the shape of a ring (referred to herein as a "perimeter seal"), which laterally surrounds the OLED region 116. In this embodiment, the substrate layer 110, barrier layer 120 and ring-shaped adhesive layer 130 cooperate to surround the OLED region 116, protecting it from species in the outside environment. Because the adhesive layer 130 need not come into contact with the OLED region 116, this embodiment is beneficial, for example, where the adhesive layer 130 contains particulate materials that could harm the OLED region 116.

A getter material 118 may also be provided with the OLED structures 110 of the present invention, as illustrated in FIG. 4. The getter material can be essentially any getter material that reacts readily with active gases (including water and oxygen), forming stable low-vapor-pressure chemical compounds so as to remove the active gases from the gas phase. The getter material 118 is provided to remove reactive gases such as water and oxygen in the event that they penetrate the sealed package, before these gases have the opportunity to cause damage to the OLED region 116. Desiccants, which are a class of getter material that remove water, are useful for the practice of the present invention.

Preferred getter materials include Group IIA metals and metal oxides, such as calcium metal (Ca), barium metal (Ba), calcium oxide (CaO) and barium oxide (BaO). Preferred products include HICAP2000, a calcium oxide paste obtainable from Cookson SPM (Alpha Metals). Metal getter layers can be applied, for example, to the substrate layer or barrier layer using a number of techniques including vacuum deposition techniques such as thermal evaporation, sputtering, and electron-beam techniques. Essentially any desired pattern can be formed, for example, by resorting to a mask such as a shadow mask during the deposition process. Patterned getter layers in paste form, such as the above-mentioned CaO paste, can be provided by a number of techniques including screen-printing and dispensation through a syringe.

In some instances, the patterned getter material may have marginal flexibility for the application at hand, for example, when the material is used within a FOLED. One way to address this issue is to make the dimensions of the getter material small, for example, by providing the getter material in a patterned layer consisting of a number of narrow bands or dots.

In some embodiments of the present invention, a getter material is provided within the adhesive layer.

Figure 5:
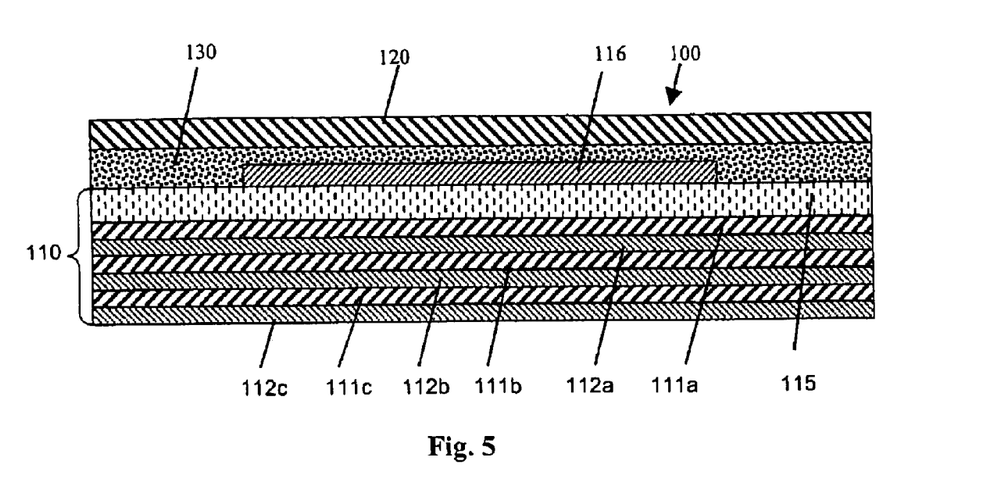
FIG. 5 is a schematic cross-sectional view of an OLED structure in accordance with still another embodiment of the present invention.

As noted above, composite materials are among those materials preferred for use in connection with the substrate layer 110 and/or barrier layer 120. Referring now to FIG. 5, for example, an OLED structure 100 is illustrated, which is like that of that of FIG. 2, except that the substrate layer 110 of FIG. 5 is shown as comprising a substrate sub-layer 115 and a series cooperative barrier sub-layers. The cooperative barrier sub-layers include both sub-layers of planarizing material 111a–c and sub-layers of high-density material 112a–c. These cooperative barrier sub-layers are preferably provided in an alternating configuration. Preferably, 1 to 10 pairs of these sub-layers, more preferably 3 to 7 pairs, are used. Thus, although three alternating pairs are illustrated in FIG. 3, other sub-layer arrangements are possible.

The cooperative barrier sub-layers 111a–c and 112a–c are disposed adjacent the polymeric substrate sub-layer 115 in the embodiment shown in FIG. 5. As a result, during manufacture, the substrate sub-layer 115 can act as a foundation upon which the cooperative barrier sub-layers 111a–c and 112a–c can be laid.

Where flexibility is desired, the substrate sub-layer 115 may comprise paper, fabric, metal foil, flexible glass (available, for example, from Schott Glass Technologies) and/or polymer layers. Flexibility is desirable, for example, in the manufacture of FOLEDs and renders the devices formable using web-based, roll-to-roll manufacturing techniques. More preferred flexible substrate sub-layer materials are those that comprise one or more polymer components, including polyesters, polycarbonates, polyethers, polyimides, polyolefins, and fluoropolymers that are capable of providing a strong adhesive bond with other materials. Such polymer components can be supplied, for example, in connection with homopolymers, copolymers and polymer blends. Examples of some preferred polymer components include, for example, polyethersulphones, polyarylates, polyestercarbonates, polyethylenenaphthalates, polyethyleneterephthalates, polyetherimides, polyacrylates, polyimides such as Kapton® polyimide film available from DuPont, fluoropolymers such as Aclar® fluoropolymer available from Honeywell, Appear® PNB (polynorbornene) available from BF Goodrich and Arton® available from BF Goodrich. The substrate sub-layer 115 in this instance typically ranges from 75 to 625 microns in thickness.

By "planarizing material" is meant a material that forms a smooth planar surface upon application, rather than forming a surface that reflects irregular contours of the underlying surface. Preferred planarizing materials include polymers, such as fluorinated polymers, parylenes, cyclotenes and polyacrylates and combinations thereof. Sub-layers of such planarizing materials 111a–111c can be provided using techniques known in the art, for example, by dipping, spin coating, sputtering, evaporative coating, spraying, flash evaporation, chemical vapor deposition and so forth.

By "high-density material" is meant a material with sufficiently close atomic spacing such that diffusion of contaminant and deleterious species, particularly water and oxygen, are hindered. Preferred high-density materials include inorganic materials such as metal oxides, metal nitrides, metal carbides and metal oxynitrides and combinations thereof. More preferred are silicon oxides (SiOx), including silicon monoxide (SiO) and silicon dioxide (SiO$_2$), silicon nitrides (typically Si$_3$N$_4$), silicon oxynitrides, aluminum oxides (typically Al$_2$O$_3$), indium-tin oxides (ITO) and zinc indium tin oxides and combinations thereof. Sublayers of high-density material 112a–112c can be applied using techniques known in the art such as thermal evaporation, sputtering, PECVD methods and electron-bean techniques.

Examples of composite barrier layers comprising sub-layers of both high-density material and planarizing material formed on a polymer substrate sub-layer are disclosed, for example, in U.S. Pat. No. 5,757,126, the entire disclosure of which is hereby incorporated by reference.

Figure 6:
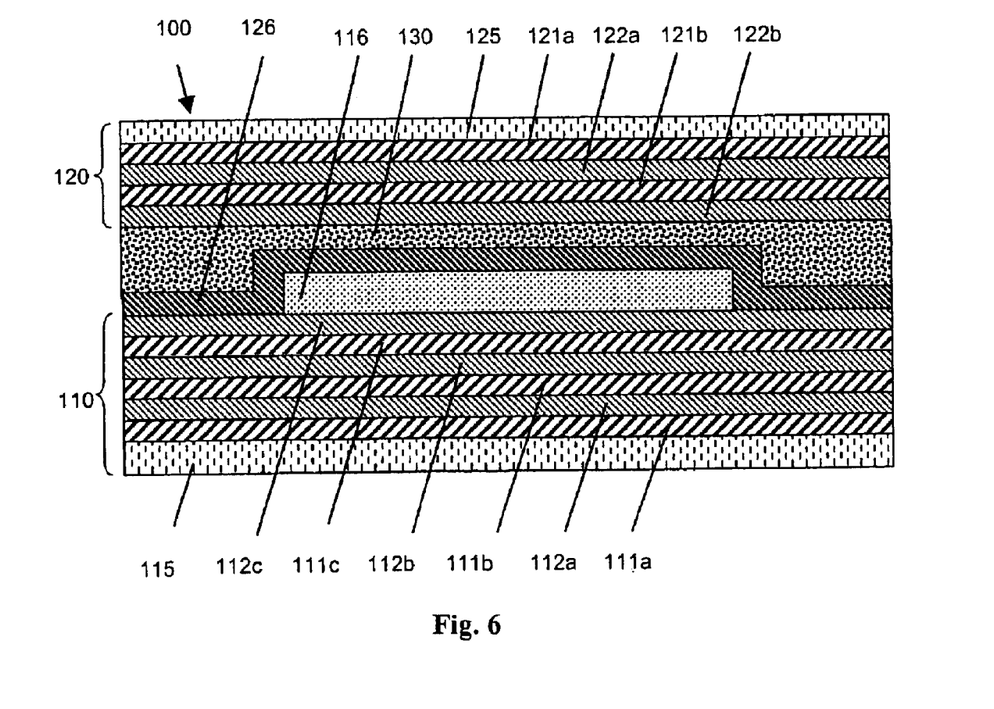
FIG. 6 is a schematic cross-sectional view of an OLED structure in accordance with another embodiment of the present invention.

It is noted that the substrate layer 110 as illustrated in FIG. 5 can be inverted such that the substrate sub-layer 115 is at the bottommost position, as is seen in FIG. 6. Moreover, if desired, the barrier layer 120 can include a composite barrier layer. For example, as seen in FIG. 6, a barrier layer 120 is provided which includes a substrate sub-layer 125, planarizing materials 121a–b and high-density layers 122a–b.

As noted above, due to their flexibility, composite substrates 110 and composite barrier layers 120 are useful in connection with FOLED devices. Their flexibility also renders them useful for web-based, roll-to-roll processing.

Figure 7:
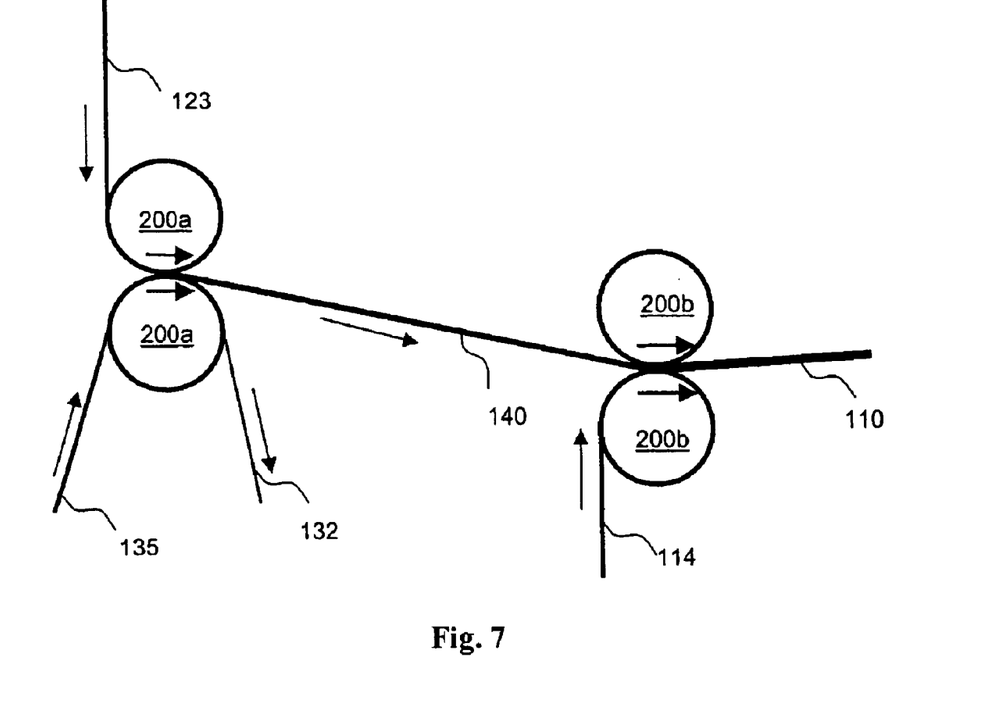
FIG. 7 is a schematic illustration of an OLED structure lamination process, in accordance with an embodiment of the present invention.

One example of a web-based scheme for attaching a barrier region 123 (containing a flexible barrier layer, for example) to an OLED containing region 114 (containing a substrate layer, an OLED region, and a protective layer, for example) is illustrated in FIG. 7. As seen in this figure, the flexible barrier region 123 and an adhesive containing layer 135 (which includes an adhesive layer and an adjacent release layer in this example) are fed through heated rollers 200a to soften the adhesive and prevent bubbles from becoming established between the barrier region 123 and the adhesive layer. After emerging from the rollers 200a, the release layer 132 is removed. The resulting adhesive barrier region 140 (which consists of barrier region 123 layer with adjacent adhesive layer in this embodiment) is then fed, along with the OLED containing region 114, through heater rollers 200b to again facilitate bubble removal. After emerging from the rollers 200b, the resulting OLED structure 110 is exposed to ultraviolet light to cure the adhesive layer. The positions of the barrier region 123 and the OLED containing region 114 in FIG. 7 can be reversed, if desired.

Figure 8:
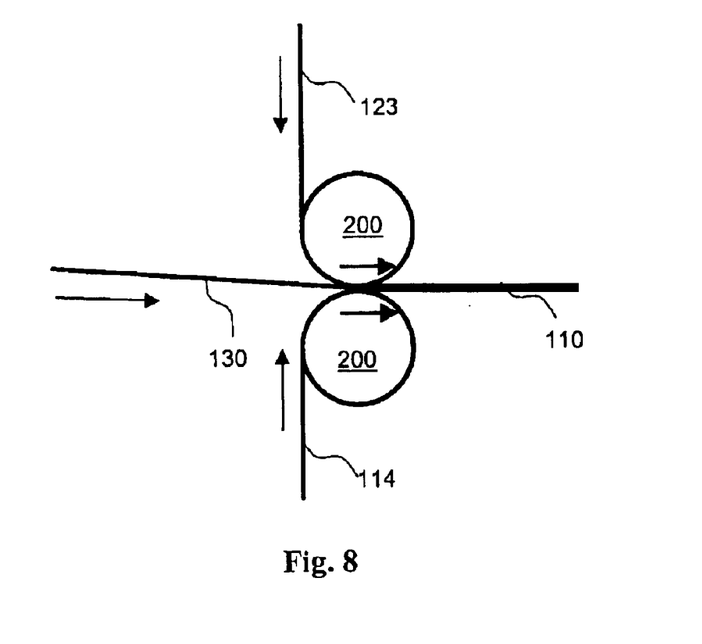
FIG. 8 is a schematic illustration of an OLED structure lamination process, in accordance with another embodiment of the present invention.

Another processing scheme is illustrate in FIG. 8. As seen in this figure, a flexible barrier region 123 (containing a flexible barrier layer, for example), an adhesive layer 130, and an OLED containing region 114 (containing, for example, a substrate layer, an OLED region, and a protective layer) are simultaneously fed through heated rollers 200. As above, the heated rollers soften the adhesive and prevent bubbles from persisting between the adhesive layer 130 and the adjacent layers 120, 114. After emerging from the rollers 200, the resulting OLED structure 110 is exposed to ultraviolet light to cure the adhesive layer.

Figure 9:
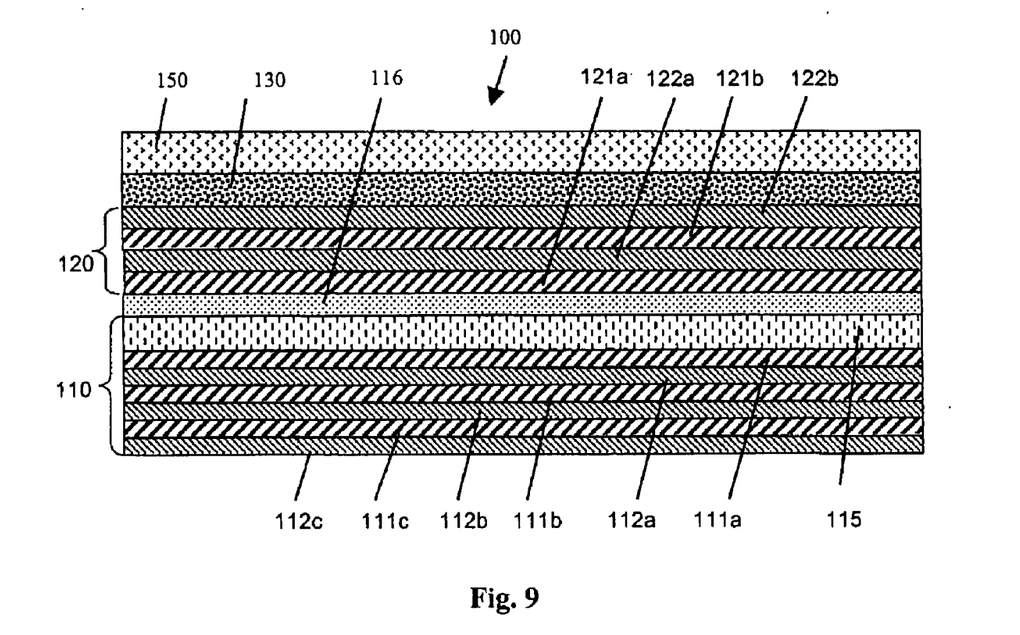
FIG. 9 is a schematic cross-sectional view of an OLED structure in accordance with another embodiment of the present invention.

Numerous additional variations are possible in accordance with the present invention, an example of which is illustrated in FIG. 9. Like FIGS. 5 and 6, an OLED region 116 is disposed over a substrate layer 110 that includes a substrate sub-layer 115 and an alternating series of planarizing material sub-layers 111a–c and high-density material planarizing material 112a–c. Moreover, like FIG. 6, the OLED structure of FIG. 9 contains a barrier layer 120, which includes planarizing material sub-layers 121a–b and high-density sub-layers 122a–b. However, the barrier layer 120 of FIG. 9 does not contain a substrate sub-layer 125, because the planarizing material sub-layers 121a–121b and high-density sub-layers 122a–122b have been deposited directly over the OLED region 116, eliminating the need for a separate substrate sub-layer. Finally, a top layer 150 is attached to the remainder of the structure via adhesive layer 130. Top layer 150 can be provided with a number of desirable properties, including barrier properties, scratch resistance, antireflective properties, circular polarizing properties and so forth. Hence, in the embodiment illustrated in FIG. 9, the adhesive region 130 is disposed between one region containing a top layer 150 and another region containing substrate layer 110, OLED region 116 and barrier layer 120. This is in contrast with the embodiments of FIGS. 3–6, in which the adhesive layer 130 adheres one region containing a substrate layer 110 and an OLED region 116 to another region containing a barrier layer 120.

Figure 10:
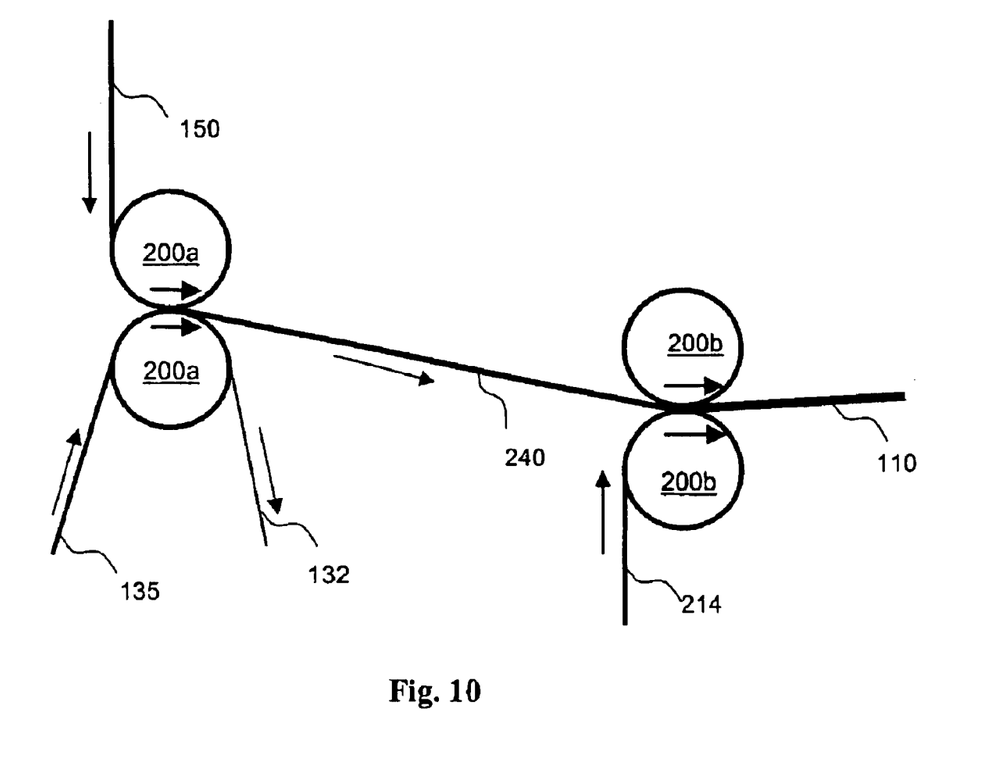
FIG. 10 is a schematic illustration of an OLED structure lamination process, in accordance with another embodiment of the present invention.

One example of a web-based scheme for attaching a top layer 150 to an OLED containing region 214 (containing a substrate layer, an OLED region, and a barrier layer, for example) is illustrated in FIG. 10. As seen in this figure, the top layer 150 and an adhesive containing layer 135 (which includes an adhesive layer and an adjacent release layer in this example) are fed through heated rollers 200a to soften the adhesive and prevent bubbles from persisting between the top layer 150 and the adhesive layer. After emerging from the rollers 200a, the release layer 132 is removed. The resulting adhesive top region 240 (which consists of top layer 150 layer with adjacent adhesive layer in this embodiment) is then fed, along with the OLED containing region 214, through heated rollers 200b to again facilitate bubble removal. After emerging from the rollers 200b, the resulting OLED structure 110 is exposed to ultraviolet light to cure the adhesive layer. The positions of the top layer 150 and the OLED containing region 214 in FIG. 10 can be reversed, if desired the fabrication of the OLED structure 110. Moreover, a process analogous to the process of FIG. 8 can also be used to fabricate the OLED structure 110.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

What is claimed is:

1. An organic electronic device structure comprising:
   a substrate layer;
   an organic electronic region disposed over the substrate layer;
   a pressure sensitive adhesive layer disposed over the substrate layer and over the organic electronic region;
   a barrier layer disposed over the adhesive layer; and
   a protective layer between said organic electronic region and said adhesive layer,
   wherein said organic electronic device structure is a flexible organic electronic device structure.

2. The organic electronic device structure of claim 1, wherein said organic electronic region is an OLED region.

3. The organic electronic device structure of claim 2, wherein said adhesive layer is a low-temperature-curable adhesive layer.

4. The organic electronic device structure of claim 2, wherein said adhesive layer is a radiation-curable adhesive layer.

5. The organic electronic device structure of claim 2, wherein said adhesive layer is an ultraviolet-radiation-curable adhesive layer.

6. The organic electronic device structure of claim 2, wherein said adhesive layer displays low out-gassing of harmful species.

7. The organic electronic device structure of claim 2, wherein said adhesive layer is in the form a continuous layer that is disposed over the entire OLED region.

8. The organic electronic device structure of claim 2, wherein said adhesive layer is in the form of a ring that is disposed over only a portion of the OLED region.

9. The organic electronic device structure of claim 2, further comprising a getter material.

10. The organic electronic device structure of claim 9, wherein the getter material is provided in said adhesive layer.

11. The organic electronic device structure of claim 2, wherein said substrate layer is selected from a metal layer, a semiconductor layer, a glass layer, a ceramic layer, a polymer layer and a composite material layer.

12. The organic electronic device structure of claim 2, wherein said substrate layer is a composite material layer that comprises (a) a polymer substrate sub-layer and (b) at least two alternating pairs of high-density sub-layers and planarizing sub-layers, which high-density sub-layers may be the same or different from each other and which planarizing sub-layers may be the same or different from each other.

13. The organic electronic device structure of claim 2, wherein the barrier layer is selected from a metal layer, a semiconductor layer, a glass layer, a ceramic layer, a polymer layer and a composite material layer.

14. The organic electronic device structure of claim 2, wherein the barrier layer is a composite material layer that comprises (a) a polymer substrate sub-layer and (b) at least two alternating pairs of high-density sub-layers and planarizing sub-layers, which high-density sub-layers may be the same or different from each other and which planarizing sub-layers may be the same or different from each other.

15. The organic electronic device structure of claim 1, wherein said adhesive layer is a low-temperature-curable adhesive layer.

16. The organic electronic device structure of claim 1, wherein said adhesive layer is a radiation-curable adhesive layer.

17. The organic electronic device structure of claim 1, wherein said adhesive layer is an ultraviolet-radiation-curable adhesive layer.

18. The organic electronic device structure of claim 1, wherein said adhesive layer displays low out-gassing of harmful species.

19. The organic electronic device structure of claim 1, wherein said adhesive layer is in the form a continuous layer that is disposed over the entire organic electronic region.

20. The organic electronic device structure of claim 1, wherein said adhesive layer is in the form of a ring that is disposed over only a portion of the organic electronic region.

21. The organic electronic device structure of claim 1, further comprising a getter material.

22. The organic electronic device structure of claim 21, wherein the getter material is provided in said adhesive layer.

23. The organic electronic device structure of claim 1, wherein said substrate layer is selected from a metal layer, a semiconductor layer, a glass layer, a ceramic layer, a polymer layer and a composite material layer.

24. The organic electronic device structure of claim 1, wherein said substrate layer is a composite material layer that comprises (a) a polymer substrate sub-layer and (b) at least two alternating pairs of high-density sub-layers and planarizing sub-layers which high-density sub-layers may be the same or different from each other and which planarizing sub-layers may be the same or different from each other.

25. The organic electronic device structure of claim 1, wherein the hairier layer is selected from a metal layer, a semiconductor layer, a glass layer, a ceramic layer, a polymer layer and a composite material layer.

26. The organic electronic device structure of claim 1, wherein the barrier layer is a composite material layer that comprises (a) a polymer substrate sub-layer and (b) at least two alternating pairs of high-density sub-layers and planarizing sub-layers, which high-density sub-layers may be the same or different from each other and which planarizing sub-layers may be the same or different from each other.

27. The organic electronic device structure of claim 1, wherein said protective layer comprises a material selected from a silicon oxide, a silicon nitride, a silicon oxynitride, a metal oxide, an organic compound and an organometallic compound.

28. The organic electronic device structure of claim 1, wherein said protective layer comprises one or more high-density sub-layers and one or more planarizing sub-layers.

29. The organic electronic device structure of claim 2, wherein said protective layer comprises a material selected from a silicon oxide, a silicon nitride, a silicon oxynitride, a metal oxide, an organic compound and an organometallic compound.

* * * * *

UNITED STATES PATENT AND TRADEMARK OFFICE
CERTIFICATE OF CORRECTION

PATENT NO. : 6,835,950 B2
DATED : December 28, 2004
INVENTOR(S) : Julia J. Brown et al.

It is certified that error appears in the above-identified patent and that said Letters Patent is hereby corrected as shown below:

Column 6,
Line 34, after "formation of", delete -- an --.
Line 38, after "adhesive", change "layers" to -- layer --.
Line 52, after "8141", insert -- , --.

Column 7,
Line 6, delete first word "is".
Line 56, after "cure", delete "of".

Column 9,
Line 11, after "that" (first occurrence), delete -- of that --.
Line 13, after "series", insert -- of --.
Line 20, before "other", change "FIG. 3" to -- FIG. 5 --.

Column 10,
Line 8, after "methods and", change "electron-bean" to -- electron-beam --.

Column 11,
Line 34, after "if desired", insert -- , during --.

Column 13,
Line 2, after "sub-layers" (first occurrence), insert -- , --.
Line 7, before "layer" (first occurrence), change "hairier" to -- barrier --.

Signed and Sealed this

Thirty-first Day of May, 2005

JON W. DUDAS
*Director of the United States Patent and Trademark Office*